United States Patent [19]
Padgett

[11] 4,079,332
[45] Mar. 14, 1978

[54] HIGH GAIN DIFFERENTIAL AMPLIFIER

[75] Inventor: Clarence W. Padgett, Westminster, Calif.

[73] Assignee: Rockwell International Corporation, El Segundo, Calif.

[21] Appl. No.: 744,067

[22] Filed: Nov. 22, 1976

[51] Int. Cl.² .......................... H03F 3/45; H03F 3/16
[52] U.S. Cl. ..................................... 330/253; 330/260
[58] Field of Search .................... 330/18, 19, 26, 22, 330/30 D, 35

[56] References Cited
U.S. PATENT DOCUMENTS 3,882,409  5/1975  Yagi .................................. 330/35 X
3,970,951  7/1976  Hoffman ........................... 330/30 D Primary Examiner—Lawrence J. Dahl
Attorney, Agent, or Firm—H. Fredrick Hamann; G. Donald Weber, Jr.; Morland C. Fischer

[57] ABSTRACT

A high gain, field effect transistor differential amplifier including first and second cascade connected inverter stages and a feedback controlled source of current connected to each of the stages. High voltage gain is achieved by virtue of a positive feedback path connected between an output terminal of the differential amplifier and the source of current so that the current in each inverter stage is controlled.

8 Claims, 4 Drawing Figures

HIGH GAIN DIFFERENTIAL AMPLIFIER

BACKGROUND OF THE INVENTION

1. Field of the Invention

This invention relates to a high gain, field effect transistor differential amplifier.

2. Prior Art

Conventional differential amplifiers achieve relatively low voltage gain. Moreover, these amplifiers are typically implemented by the interconnection of non-complementary transistor devices. This has the undesirable effect of limiting the output voltage swing of the amplifier due to an inherent threshold level drop in voltage. What is more, many amplifier circuits are dynamic in operation, requiring bootstrap capacitor means and clocked precharge circuits. This is disadvantageous, inasmuch as the size and cost of the amplifier circuit are increased.

Examples of prior art circuits include the following:
U.S. Pat. No. 3,700,981 Oct. 24, 1972
U.S. Pat. No. 3,775,693 Nov. 27, 1973
U.S. Pat. No. 3,875,887 Apr. 8, 1975.

SUMMARY OF THE INVENTION

Briefly, and in general terms, a metal oxide semiconductor field effect transistor (MOSFET) high gain differential amplifier circuit is disclosed. The circuit includes a pair of cascade connected inverter stages, each stage connected to a source of relatively positive reference potential ($V_{DD}$). Each inverter stage has an input and output terminal and is comprised of a series connected depletion mode FET device and an enhancement mode FET device. An additional enhancement mode FET device is connected between a source of relatively negative reference potential, such as ground, and a common electrical junction formed by the inverter stages. A positive feedback path is connected between the output terminal of a first inverter stage and the control electrode of the additional FET, whereby the current in each inverter stage is controlled. A high gain signal (having a wide voltage swing to full $V_{DD}$) is achieved at the output terminal of the second inverter stage.

The presently disclosed circuit is completely static in operation, thereby requiring no bootstrap capacitors or precharge clocking arrangements. Moreover, a high gain output signal is achieved while the number of components utilized and the corresponding cost are minimized.

DESCRIPTION OF THE PREFERRED EMBODIMENT

Figure 1A:
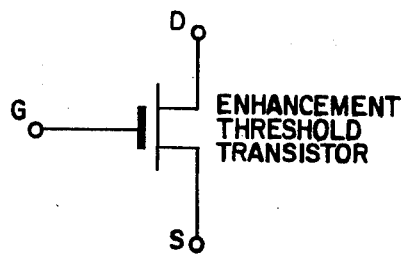
FIGS. 1a and 1b show respective electrical symbols representative of the enhancement mode and depletion mode threshold transistors used to form the high gain differential amplifier of the instant invention.
Figure 1B:
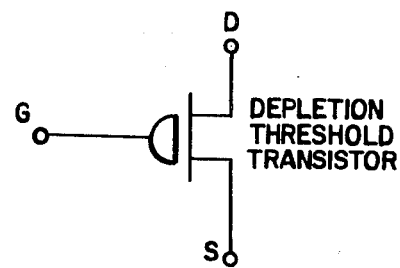

Referring to the drawings, FIGS. 1a and 1b show electrical symbols representative of an enhancement mode threshold field effect transistor (FET) and a depletion mode threshold field effect transistor (FET), respectively. The enhancement mode threshold transistor illustrated in FIG. 1a may be typically fabricated by (ion) implanting the channel region of an n-channel field effect transistor device with a p-type semiconductive material. That is, an enhancement mode transistor is normally rendered non-conducting. A relatively positive voltage applied across the source-gate junction is required to render the enhancement mode transistor conducting. The depletion mode threshold transistor illustrated in FIG. 1b may be typically fabricated by (ion) implanting the channel region of an n-channel field effect transistor device with an n-type semiconductive material. Hence, a depletion mode transistor is normally rendered conducting (and, thereby, has the approximate electrical characteristics of a resistor).

Figure 2:
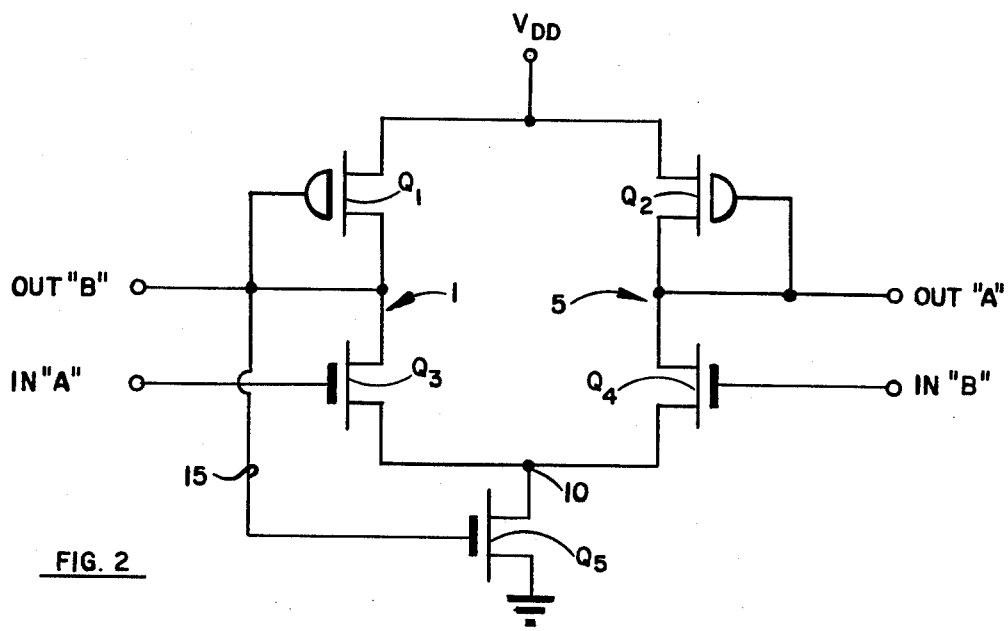
FIG. 2 shows a preferred circuit to implement the presently disclosed differential amplifier.

FIG. 2 shows a preferred circuit for implementing the high gain differential amplifier of the present invention. The conduction path of a first depletion mode FET $Q_1$ is electrically connected in series with the conduction path of a first enhancement mode FET $Q_3$. The control or gate electrode and one conduction path electrode of FET $Q_1$ are connected together to form an output terminal B. The gate electrode of FET $Q_3$ forms an input terminal A. The conduction path of a second depletion mode FET $Q_2$ is electrically connected in series with the conduction path of a second enhancement mode FET $Q_4$. The control or gate electrode and one conduction path electrode of FET $Q_2$ are connected together to form an output terminal A. The gate electrode of FET $Q_4$ forms an input terminal B. The series-connected conduction paths of FETs $Q_1$ and $Q_3$ are electrically connected in parallel with the series connected conduction paths of FETs $Q_2$ and $Q_4$ between a relatively positive source of reference voltage, $V_{DD}$ (e.g. a +5.0 volt d.c. supply), and a common electrical junction 10. Thus, as will be recognized by those skilled in the art, FETs $Q_1$ and $Q_3$ comprise a first inverter stage 1 cascaded with a second inverter stage 5 comprised of FETs $Q_2$ and $Q_4$.

In a preferred embodiment, depletion FETs $Q_1$ and $Q_2$ function as matched load resistors (i.e. they are chosen with identically narrow and long channels and, thus, high resistances). Enhancement FETs $Q_3$ and $Q_4$ are also matched in size (i.e. they are chosen with identically wide and short channels and, consequently, relatively low resistances).

As previously disclosed, inverter stages 1 and 5 are formed by the interconnection of enhancement and depletion mode transistor devices $Q_1 - Q_4$. As will be explained in greater detail hereinafter, the utilization of enhancement and depletion mode transistors advantageously enhances wider voltage swing at output terminal A. Conventional differential amplifiers are typically formed from the interconnection of all enhancement mode transistors. Hence, the signal at output terminal A is subjected to an undesirable inherent threshold level drop, $V_t$, in voltage. This threshold level drop in voltage may be overcome by the addition of a well-known bootstrap capacitor (e.g. connected across the source and gate electrodes of a device such as FET $Q_1$). Moreover, a clocking circuit is required in order to suitably precharge the aforementioned bootstrap capacitor. The presently disclosed, high gain differential amplifier is both compact in implementation and static in operation, requiring neither bootstrap capacitor nor precharge circuit means. Thus, space is conserved and cost is effectively minimized. Moreover, and by virtue of a positive feedback path 15, output terminal A can be driven to full $V_{DD}$ voltage via the conduction path of depletion mode FET $Q_2$.

In accordance with the instant invention, the conduction path of an additional enhancement mode FET $Q_5$ is connected between common electrical junction 10 and a source of relatively negative reference potential, such as ground. In operation, FET $Q_5$ functions as a feedback controlled, variable source of current. In the present embodiment, the channel width of FET $Q_5$ is about half that of either FETs $Q_3$ or $Q_4$. However, the actual width of FET $Q_5$ is selected to provide optimum amplifier performance with respect to the voltage level of the signal applied to input terminal B. The more positive the signal level applied to input terminal B, the narrower the channel width required for FET $Q_5$. Positive feedback path 15 is connected between output terminal B and the gate electrode of FET $Q_5$ whereby the conduction of FET $Q_5$ is controlled. FET $Q_5$ controls the respective currents in inverter stages 1 and 5. The present high gain amplifier has a differential input (i.e. between input terminals A and B). However, the present amplifier has a single ended output (i.e. at output terminal A), inasmuch as output terminal B is connected, via feedback path 15, to the gate electrode of FET $Q_5$. Input terminal B receives a constant signal (e.g. +2.0 volts d.c.). However, it is to be understood, that other suitable input signals may also be applied to input terminal B.

Figure 3:
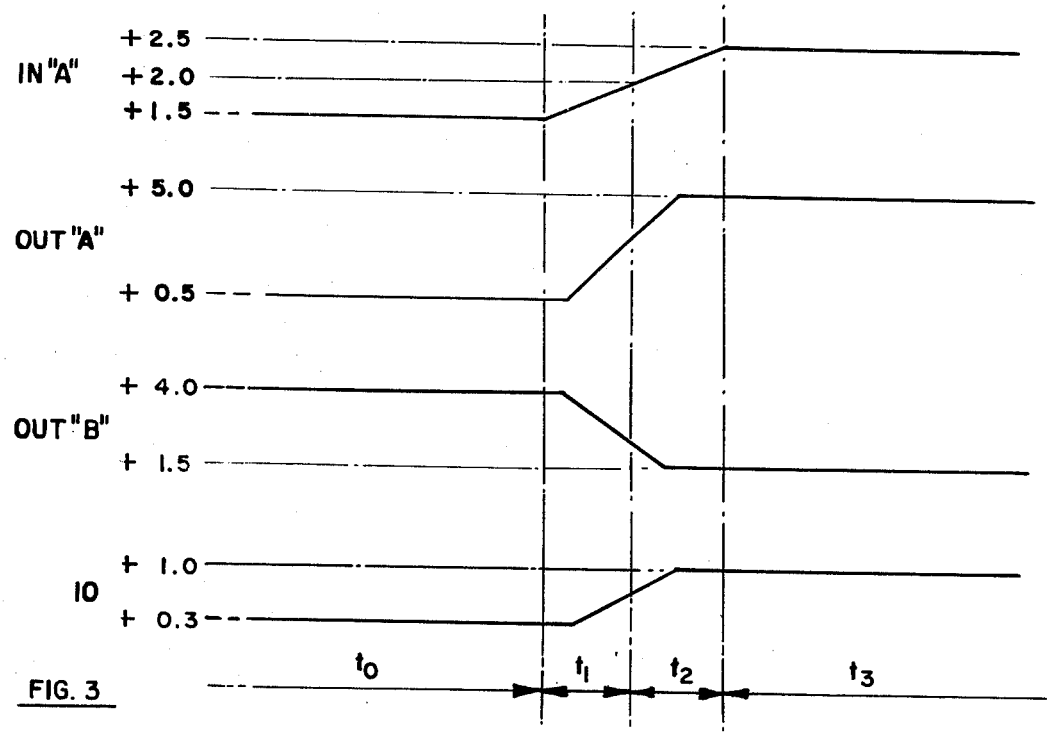
FIG. 3 shows waveforms representative of signals applied at selected terminals of the differential amplifier circuit of FIG. 2.

The operation of the present high gain differential amplifier is described by concurrently referring to FIGS. 2 and 3. During an initial interval of time, designated $t_0$, differential input signals are applied to input terminals A and B. Therefore, during the $t_0$ interval input terminal A receives +1.5 volts d.c. and input terminal B receives +2.0 volts d.c. (as previously disclosed). The differential input signals produce a current imbalance (i.e. more current is conducted by inverter stage 5 than inverter stage 1), inasmuch as FET $Q_4$ is driven harder than FET $Q_3$. FET $Q_3$ is rendered nearly non-conductive, and output terminal B is, therefore, driven close to $V_{DD}$ (e.g. approximately +4.0 volts d.c.) via the conduction path of FET $Q_1$. The relatively large positive signal at output terminal B is applied to the gate electrode of FET $Q_5$ via feedback path 15. Hence, FET $Q_5$ is turned on hard (i.e. the inherent impedance thereof is substantially minimized). Therefore, common electrical junction 10 is clamped to a voltage (+0.3 volts) close to ground via the conduction path of FET $Q_5$. Output terminal A is, thereby, driven to approximately +0.5 volts, during the $t_0$ interval, via the relatively low impedance conduction paths of FETs $Q_4$ and $Q_5$.

During the succeeding interval of time, designated $t_1$, input terminal A is driven more positive (increased from +1.5 volts during the $t_0$ interval). Therefore, FET $Q_3$ is turned on harder and more current is conducted therethrough. Output terminal B is driven relatively negative (pulled down from +4.0 volts during the $t_0$ interval) via the conduction paths of FETs $Q_3$ and $Q_5$, whereby a relatively negative signal is applied to the gate electrode of FET $Q_5$ via feedback path 15. Hence, the conductivity of FET $Q_5$ decreases during the $t_1$ interval. As a result, the voltage of common electrical junction 10 is increased (i.e. more positively pulled up) during the $t_1$ interval. The increased positive voltage of electrical junction 10 is applied to one conduction path electrode of each of FETs $Q_3$ and $Q_4$. This acts to reduce the conduction of FET $Q_4$ while causing FET $Q_3$ to be driven still harder, inasmuch as the voltage applied to input terminal A rises faster than that applied to junction 10. Output terminal A is, thereby, more positively driven during the $t_1$ interval, via the conduction path of FET $Q_2$.

At the end of the $t_1$ interval, the signals applied to differential input terminals A and B identical (+2.0 volts). Hence, the corresponding currents conducted through inverter stages 1 and 5, respectively, are also equivalent. Since the characteristics of FETs $Q_1$ and $Q_2$ and FETs $Q_3$ and $Q_4$ are matched with respect to one another, each of the output terminals A and B is driven to an identical voltage of approximately $V_{DD}/2$ (e.g. +2.5 volts d.c.).

During the next interval of time, designated $t_2$, input terminal A continues to be driven more positive (from +2.0 volts at the termination of the $t_1$ interval). As a result, FET $Q_3$ receives a larger (i.e. more positive) driving voltage and, thereby, conducts more current than FET $Q_4$. As a result, output terminal B decreases in voltage. Moreover, the conduction of FET $Q_5$ is decreased, because of the decrease in voltage at output terminal B. Hence, common electrical junction 10 is also driven more positive, inasmuch as the conduction of FET $Q_3$ is increased and the conduction of FET $Q_5$ is decreased. At the end of the $t_2$ interval and the beginning of the subsequent $t_3$ time interval, input terminal A continues to be driven more positive (e.g. to +2.5 volts d.c.). Therefore, FET $Q_3$ is driven still harder and FET $Q_5$ is rendered nearly non-conducting, while the voltage of common electrical junction 10 is also correspondingly pulled up (e.g. to +1.0 volts d.c.). The signal applied at common electrical junction 10 at the beginning of the $t_3$ interval is sufficiently positive to render FET $Q_4$ non-conducting (i.e. insufficient threshold potential exists between the gate and source electrodes thereof). By virtue of the herein disclosed high gain amplifier, output terminal A is ultimately driven to full $V_{DD}$ voltage (i.e. approximately +5.0 volts) via the conduction path of FET $Q_2$ during the $t_3$ interval. Output terminal B is driven to a relatively negative voltage (pulled down to +1.5 volts).

It will be apparent that while a preferred embodiment of the invention has been shown and described, various modifications and changes may be made without departing from the true spirit and scope of the invention. For example the presently disclosed high gain differential amplifier may form a sense amplifier to be connected to an array of information storage cells to provide a suitable indication as to the condition of the information contained therein. It is also to be understood that the voltage levels illustrated in FIG. 3 are for exemplary purposes only. The signals applied to input terminals A and B, as well as that supplied from the $V_{DD}$ voltage source, may be conveniently selected, as desired, for a particular application.

Having set forth a preferred embodiment of the instant invention, what is claimed is:

1. In combination:

first, second, third and fourth multi-terminal semiconductor devices having respective conduction path terminals and a control terminal, the conduction paths of the first and second of said multi-terminal devices connected in a first series circuit, the conduction paths of the third and fourth of said multiterminal devices connected in a second series circuit, said first and second series circuits connected together to form a first electrical junction with a source of relatively positive reference potential, a first output terminal connected to both the control terminal of said first device and to the first series circuit formed by the conduction paths of said first and second devices, a second output terminal connected to both the control terminal of said third device and to the second series circuit formed by the conduction paths of said third and fourth devices, first and second input terminals respectively connected to the control terminals of said second and fourth devices, a fifth multi-terminal semiconductor device having conduction path terminals and a control terminal, said fifth multi-terminal semiconductor device connected between a source of relatively negative reference potential and a second electrical junction formed by the connection together of said first and second series circuits, and positive feedback means connected between said first output terminal and the control terminal of said fifth multi-terminal device to control the conductivity of said fifth device.

2. The combination recited in claim 1, wherein each of said first, second, third and fourth multi-terminal semiconductor devices is a field effect transistor.

3. The combination recited in claim 2, wherein said first and third field effect transistors are depletion mode transistor devices and said second and fourth field effect transistors are enhancement mode devices.

4. The combination recited in claim 1, wherein said fifth multi-terminal semiconductor device is a field effect transistor.

5. The combination recited in claim 4, wherein said field effect transistor is an enhancement mode device.

6. The combination recited in claim 4, wherein said field effect transistor operates as a current source.

7. The combination recited in claim 1, wherein said first and second multi-terminal devices form a first inverter stage and said third and fourth multi-terminal devices form a second inverter stage, said first and second inverter stages cascaded together.

8. A high gain differential amplifier comprising:

a first inverter stage including first series connected depletion and enhancement mode transistor devices, a second inverter stage including second series connected depletion and enhancement mode transistor devices, said first and second inverter stages cascaded together between first and second electrical junctions, voltage source means connected to each of said inverter stages at a first of said electircal junctions, each of said inverter stages having respective input and output terminal means, current source means comprising an additional enhancement mode transistor device connected to each of said inverter stages at the second of said electrical junctions, and positive feedback means connecting the control terminal of said additional enhancement mode transistor device with the control terminal of said first inverter stage depletion mode transistor device and a point between the first series connected depletion and enhancement mode transistor devices of said first inverter stage to maximize the gain of said differential amplifier.

* * * * *